United States Patent
Sim

(10) Patent No.: US 9,035,817 B2
(45) Date of Patent: May 19, 2015

(54) ELECTROMAGNETIC WAVE REVERBERATION CHAMBER

(75) Inventor: Dong-Uk Sim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 642 days.

(21) Appl. No.: 13/335,025

(22) Filed: Dec. 22, 2011

(65) Prior Publication Data

US 2012/0162001 A1    Jun. 28, 2012

(30) Foreign Application Priority Data

Dec. 23, 2010    (KR) .................. 10-2010-0133406

(51) Int. Cl.
*H01Q 17/00*    (2006.01)
*G01R 29/08*    (2006.01)
*H01Q 15/00*    (2006.01)

(52) U.S. Cl.
CPC .......... *H01Q 17/008* (2013.01); *G01R 29/0821* (2013.01); *H01Q 15/0013* (2013.01)

(58) Field of Classification Search
CPC .......... H01Q 15/0013–15/0026; H01Q 17/008
USPC ........................................................ 342/1–5
See application file for complete search history.

(56) References Cited

U.S. PATENT DOCUMENTS

| | | | |
|---|---|---|---|
| 6,538,596 B1 | 3/2003 | Gilbert | |
| 7,804,439 B2 * | 9/2010 | Yoshida et al. | 342/4 |
| 7,995,968 B2 * | 8/2011 | Sotoudeh | 455/67.12 |
| 8,013,777 B2 | 9/2011 | Sim et al. | |
| 8,164,506 B2 * | 4/2012 | Sim et al. | 342/4 |
| 8,462,039 B2 * | 6/2013 | Park et al. | 342/4 |
| 2004/0134904 A1 * | 7/2004 | Clemen, Jr. | 219/709 |
| 2009/0284404 A1 * | 11/2009 | Sim et al. | 342/1 |

FOREIGN PATENT DOCUMENTS

KR    1020090118617 A    11/2009

OTHER PUBLICATIONS

Genender et al. "Use of Reverberation Chamber to Simulate the Power Delay Profile of a Wireless Environment." EMC Europe 2008 International Symposium on Electromagnetic Compatibility. Sep. 8-12, 2008. pp. 1-6.*

D. J. Kern et al., A Genetic Algorithm Approach to the Design of Ultra-Thin Electromagnetic Bandgap Absorbers, Microwave and Optical Technology Letters, Jul. 5, 2003, p. 61-64, vol. 38 No. 1, PA USA.

Olof Lunden, Absorber Loading Study in FOI 36.7 m³ Mode Stirred Reverberation Chamber for Pulsed Power Measurements, 2008 IEEE, Linkoping, Sweden.

(Continued)

*Primary Examiner* — Matthew M Barker
(74) *Attorney, Agent, or Firm* — William Park & Associates Ltd.

(57) ABSTRACT

An electromagnetic wave reverberation chamber includes: an electromagnetic wave absorbing apparatus installed in an intended space of the electromagnetic wave reverberation chamber for adjusting a reflection characteristic of an inside of the electromagnetic wave reverberation chamber, wherein the electromagnetic wave absorbing apparatus have an electromagnetic bandgap structure including a plurality of unit cells arranged periodically.

16 Claims, 7 Drawing Sheets

(56) References Cited

OTHER PUBLICATIONS

Q. Gao et al., Application of metamaterials to ultra-thin radar-absorbing material design, Electronics Letters, Aug. 18, 2005, vol. 41, No. 17.

Jung-Hwan Choi et al., Generation of Rayleigh/Rician Fading Channels With Variable RMS Delay by Changing Boundary Conditions of the Reverberation Chamber, IEEE Antennas and Wireless Propagation Letters, 2010, p. 510-513, vol. 9.

* cited by examiner

ELECTROMAGNETIC WAVE REVERBERATION CHAMBER

CROSS-REFERENCE(S) TO RELATED APPLICATION(S)

The present invention claims priority of Korean Patent Application No. 10-2010-0133406, filed on Dec. 23, 2010, which is incorporated herein by reference.

FIELD OF THE INVENTION

The present invention relates to an electromagnetic wave reverberation chamber; and more particularly, to an electromagnetic wave reverberation chamber including an electromagnetic wave absorbing apparatus to which a periodic structure technology such as an electromagnetic bandgap (EBG) is applied.

BACKGROUND OF THE INVENTION

As information technology is developed rapidly and a desire for the communication of a human being is increased, mobile communication devices such as a portable device are necessities of a contemporary man. However, the effect of the electromagnetic wave generated by the device to a human body has been being an important issue as the use of the portable device is increased. At present, a relation between the electromagnetic wave in a frequency bandwidth used in a cellular phone and the effect of the electromagnetic wave to the human body has not been disclosed clearly. However, it has been being reported that the electromagnetic can affect various diseases such as a leukemia, an encephaloma, a headache, a decreased visual acuity, a brain wave disorder when the electromagnetic wave is accumulated in the human body, the damage of the reproduction ability of a man, etc.

In addition, a malfunction between information communication devices due to undesirable electromagnetic wave is constantly reported. This is an electromagnetic interference/electromagnetic compatibility (EMI/EMC) problem. Thus, the measurement method and the acceptable standard of the unwanted frequency of an electrical and an electronic communication device are prescribed in order to prevent interference between the devices due to the unwanted frequency. Moreover, the EMC should be considered at the stage of design and manufacture to satisfy the method and the standard and the EMC test should be satisfied for selling a product.

An electromagnetic wave reverberation chamber as an experiment facility for measuring the EMI and a radiation tolerance has been reported as the experiment result of a national institute standards and technology (NIST) and an international special committee on Radio interference (CISPR) prescribed specifications for the electromagnetic wave reverberation chamber in a IEC 61000-4-21.

The electromagnetic wave reverberation chamber is a measuring chamber of which all inner walls do not absorb the electromagnetic wave so that the electromagnetic wave has optimal reverberation time and diffusivity in the chamber in contrast to an anechoic chamber. The electromagnetic wave reverberation chamber satisfies a condition that the intensity of the electromagnetic wave is uniform inside the chamber and the electromagnetic wave is propagated in all directions uniformly in the any position inside the chamber. Thus, the electromagnetic wave anechoic chamber should absorb electromagnetic wave fully by using an electromagnetic wave absorber installed on the all inner walls of the electromagnetic wave anechoic chamber. However, the electromagnetic wave reverberation chamber does not need the absorber because the all inner walls of the chamber should reflect the electromagnetic wave fully. Instead, the electromagnetic wave reverberation chamber is generally manufactured by installing a metal wall on the inner wall thereof. The electromagnetic wave reverberation chamber obtains the uniformity of the electric field by using a stirrer in order to lower lowest usable high frequency (LUF). The uniformity of the electric field can be determined by a total number of modes which can be generated in the electromagnetic wave reverberation chamber, Q-factor of the medium used for manufacturing the electromagnetic wave reverberation chamber and the efficiency of the stirrer, etc.

Meanwhile, a technology improving the performance of the electromagnetic wave reverberation chamber by using the electromagnetic wave absorber has been reported.

FIG. 1 shows an outer shape of a conventional electromagnetic wave reverberation chamber and FIG. 2 depicts an inner shape of a conventional electromagnetic wave reverberation chamber.

As shown in FIGS. 1 and 2, the electromagnetic wave reverberation chamber can be manufactured in the shape of a polyhedron. The electromagnetic wave reverberation chamber has the shape of a cube generally. All the inner wall of the chamber consists of a metal conductor for the total reflection of the electromagnetic wave, and the stirrer and a pyramidal electromagnetic wave absorber are installed in the intended space for controlling the reflection characteristic of the inside of the chamber. The pyramidal electromagnetic wave absorber improves the reflection characteristic of the inside of the chamber so that more uniform electrical field distribution can be obtained. The position, size and electromagnetic field absorption rate of the pyramidal electromagnetic wave absorber affects the total performance of the chamber.

However, the conventional pyramidal electromagnetic wave absorber is not suitable for a device to be tested since the size of the conventional pyramidal electromagnetic wave absorber is so large that the inside space of the chamber can be small. In this case, since the electromagnetic wave reverberation chamber should be manufactured to be larger, there exist problems that the manufacture cost of the electromagnetic wave reverberation chamber is raised and an installation space for the chamber should be larger.

In addition, since the conventional pyramidal electromagnetic wave absorber is manufactured by using a material having absorption characteristic and is developed by a trial and error method, there exist considerable problems that the manufacturing process of the absorber is complicated and it is difficult to adjust the absorption characteristic and a absorption frequency bandwidth.

Meanwhile, as the additional examples of the conventional electromagnetic wave absorber, there is a $4/\lambda$ type wave absorber or a flat-plate type resonant absorber such as a Salisbury screen.

The construction of the resonant absorber is simple since the resonant absorber consists of a resistive film, a dielectric spacer and a metal conductor ground surface. Thus, the resonant absorber can be manufactured easily and the absorption performance thereof can be easily adjusted. In addition, when the resonant absorber is manufactured in a multilayer form, a multiple bandwidth absorption characteristic can be obtained.

However, the conventional resonant absorber has a problem that the thickness of the dielectric spacer should be equal to or larger than $4/\lambda$ from the metal conductor ground surface.

SUMMARY OF THE INVENTION

In view of the above, the present invention provides an electromagnetic wave reverberation chamber including a small and thin electromagnetic wave absorbing apparatus to which a periodic structure such as an electromagnetic bandgap is applied.

In accordance with an embodiment of the present invention, there is provided an electromagnetic wave reverberation chamber, including:

an electromagnetic wave absorbing apparatus installed in an intended space of the electromagnetic wave reverberation chamber for adjusting a reflection characteristic of an inside of the electromagnetic wave reverberation chamber, wherein the electromagnetic wave absorbing apparatus have an electromagnetic bandgap structure.

Further, the electromagnetic wave absorbing apparatus includes a plurality of unit cells arranged periodically, wherein each of the unit cell has a metal conductor layer; a dielectric layer formed on the metal conductor layer; and a unit cell pattern formed on the dielectric layer, the unit cell pattern being made of a resistive material.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
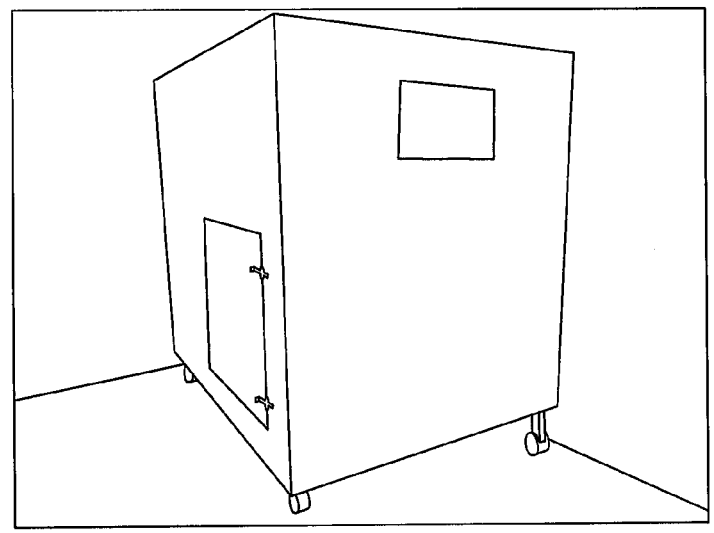
FIG. 1 shows an outer shape of a conventional electromagnetic wave reverberation chamber.

The present invention provides an electromagnetic wave reverberation chamber including an electromagnetic wave absorbing apparatus to which a periodic structure technology such as an electromagnetic bandgap (EBG) is applied.

The electromagnetic bandgap as a technique of employing a periodic structure may be implemented by periodically arranging specifically designed unit cell patterns on a typical electric conductor at regular intervals. Since a tangential component of a magnetic field at a particular band on the surface of the electromagnetic bandgap becomes zero, the electromagnetic bandgap has the characteristic of preventing current from flowing through the surface. Such an electromagnetic bandgap may be regarded as a magnetic conductor opposite to the typical electric conductor. The surface of the electromagnetic bandgap is a high-impedance surface (HIS) in configuration of a circuit.

The frequency response characteristics of the electromagnetic bandgap may be checked through a reflection phase which refers to a difference between the phases of an incident wave on the surface of the electromagnetic bandgap and a reflected wave from the surface. The reflection phase of the electromagnetic bandgap becomes zero at a resonant frequency corresponding to a high impedance surface and varies in a range from −180 degrees to 180 degrees in a frequency band around the resonant frequency. When the structural parameters of the electromagnetic bandgap are adjusted, the reflection phase may vary.

In the structure of a typical electromagnetic bandgap, a dielectric layer and an array layer of unit cell patterns other than a metal conductive ground plane constitute the typical structure of a frequency selective surface (FSS). FSS is a surface formed by artificially and periodically arranging specific unit cell patterns so as to selectively transmit or reflect desired frequencies. Therefore, an electromagnetic bandgap not only completely blocks the progression of electromagnetic waves but also has the above-described unique physical characteristics, by virtue of providing a metal conductive ground plane for the characteristics of filtering of a specific frequency due to the FSS.

Meanwhile, when this FSS is applied to a plate-type resonant electromagnetic wave absorber, a thickness and absorption performance of the electromagnetic wave absorber are able to be controlled owing to the inherent electromagnetic properties of the FSS. That is, in the resonant electromagnetic wave absorber composed of a resistive film, a dielectric spacer and a metal conductive ground plane, the FSS is interposed between the dielectric spacer and the resistive film.

The electromagnetic wave absorber formed in this way has a structure formed by adding a resistive coating to the typical structure of the EBG. Furthermore, when the unit cell patterns of the EBG are designed and made of a resistive material on a metal conductor, such a resistive EBG itself may function as a simpler electromagnetic wave absorber. Such an electromagnetic wave absorber may be applied to fields where existing electromagnetic wave absorbers have been applied in order to reduce the multiple reflection of electromagnetic waves, as a simpler structure that is easily manufactured and has low cost.

In particular, since the absorption frequency band of the electromagnetic wave absorber can be adjusted only by a simple structural or material deformation of the unit cell thereof, the electromagnetic wave absorber can selectively absorb the electromagnetic waves of a desired frequency band, so that this electromagnetic wave absorber can be very usefully used under the condition that electromagnetic waves of various frequency bands coexist. Further, since a bottom side of the electromagnetic wave absorber is made of a metal conductor, when there is a need to attach the electromagnetic wave absorber to another metal conductor, it can be directly used without changing its performance.

Hereinafter, embodiments of the present invention will be described with reference to the accompanying drawings which form a part hereof.

Figure 3:
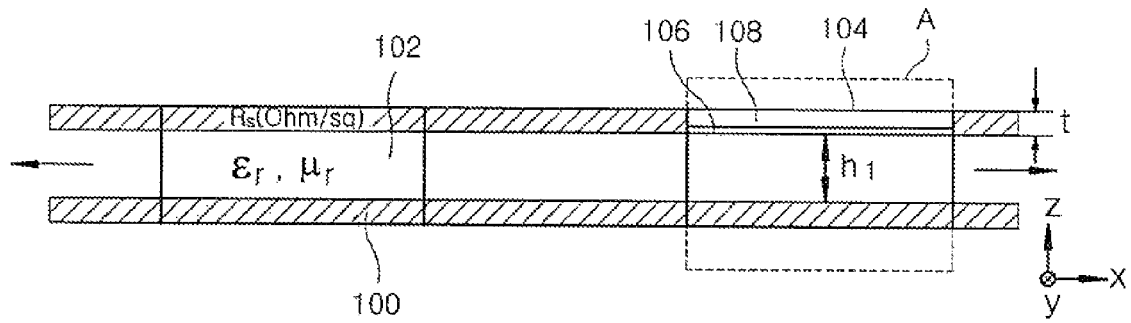
FIG. 3 illustrates an electromagnetic wave absorbing apparatus included in an electromagnetic wave reverberation chamber in accordance with an embodiment of the present invention.

FIG. 3 illustrates an electromagnetic wave absorbing apparatus included in an electromagnetic wave reverberation chamber in accordance with an embodiment of the present invention.

As shown in FIG. 3, the electromagnetic wave absorbing apparatus includes a plurality of a unit cell A arranged periodically. The unit cell A includes a metal conductor layer 100, a dielectric layer 102 formed on the metal conductor layer 100, a unit cell pattern 104 of a resistive material formed on the dielectric layer 102. For example, the unit cell pattern 104 can be substituted by a unit cell pattern of a metal material 106 and a resistive film 108 formed on the unit cell pattern.

The unit cell A including the dielectric layer 102 and the unit cell pattern 104 of the resistive material is a structure where a loss is added to a frequency selective surface. An incident wave can be partially reflected by the unit cell A and the incident wave can penetrate partially the unit cell A in a desired frequency. A phase in the dielectric can be adjusted by the unit cell A. In addition, the conductor layer 100 can totally reflect an electromagnetic wave penetrating partially the unit cell A. Eventually, an absorption frequency can be determined by the capacitance C and the inductance L of the unit cell pattern 104 from the height of the dielectric layer 102 as an electromagnetic bandgap shape. The height of the dielectric layer 102 is formed more lower than $\lambda/4$, i.e., a height needed for absorption, by the reflection phase characteristic of the electromagnetic bandgap so that the electromagnetic wave penetrating partially the unit cell pattern A can be attenuated.

A height '$h_1$' from the metal conductor layer 100 to the unit cell pattern 104, dielectric characteristics '$\in_r$' and '$\mu_r$,' the thickness 't' of the unit cell pattern functions as parameters for an absorption performance so that the absorption bandwidth and the absorption performance of the electromagnetic wave can be adjusted. Here, the same design parameters can be differently adjusted in each direction and in this case, electromagnetic waves in the different frequency bandwidths can be absorbed at the same time in both directions.

Figure 2:
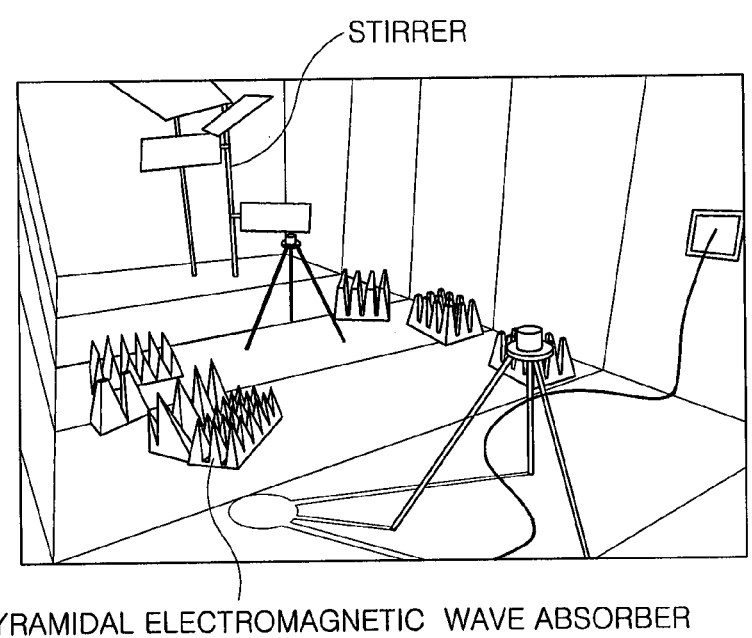
FIG. 2 depicts an inner shape of an electromagnetic wave reverberation chamber including a conventional pyramidal electromagnetic wave absorber.

The electromagnetic wave reverberation chamber in accordance with an embodiment of the present invention can be manufactured by substituting the electromagnetic wave absorbing apparatus in accordance with the embodiment of the present invention for the conventional pyramidal electromagnetic wave absorber in the electromagnetic wave reverberation chamber of FIGS. 1 and 2.

The electromagnetic wave absorbing apparatus is installed in the intended space inside the electromagnetic wave reverberation chamber in accordance with an embodiment of the present invention in order to adjust a reflection characteristic inside the electromagnetic wave reverberation chamber and the electromagnetic wave absorbing apparatus has an electromagnetic bandgap structure.

The electromagnetic wave reverberation chamber has a polyhedron shape (e.g., a cube shape) and all walls inside the electromagnetic wave reverberation chamber are made of the metal conductor for the total reflection. The stirrer and the electromagnetic wave absorbing apparatus in accordance with an embodiment of the present invention are installed in the intended space in order to adjust an inside reflection characteristic.

Here, the stirrer is selectively installed when it is needed to form a uniform field of the inside of the electromagnetic wave reverberation chamber. Thus, the stirrer can be excluded.

In addition, when the electromagnetic wave absorbing apparatus is installed inside the electromagnetic wave reverberation chamber, the electromagnetic wave absorbing apparatus can be installed not only on the bottom of the electromagnetic wave reverberation chamber but also on the wall of the electromagnetic wave reverberation chamber.

Figure 4:
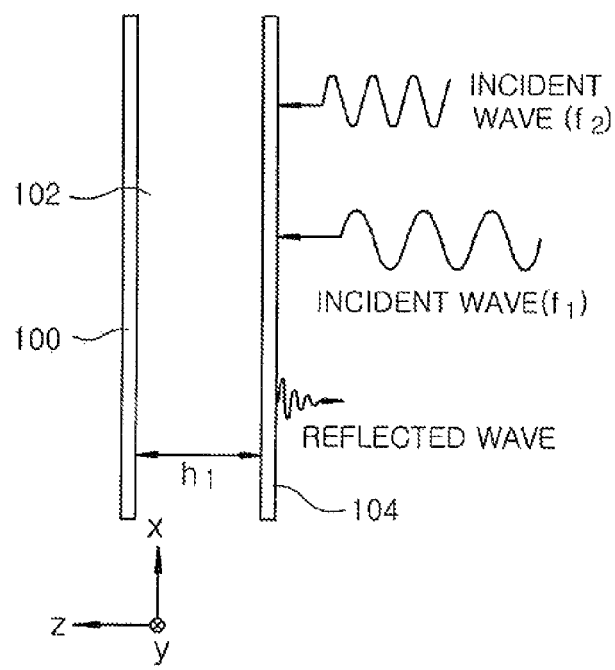
FIG. 4 shows a concept of an electromagnetic wave absorption by an electromagnetic wave absorbing apparatus included in an electromagnetic wave reverberation chamber in accordance with an embodiment of the present invention.

FIG. 4 illustrates a concept of an electromagnetic wave absorption by an electromagnetic wave absorbing apparatus included in an electromagnetic wave reverberation chamber in accordance with an embodiment of the present invention.

An absorption performance that a reflection wave is rarely shown when electromagnetic waves of various frequency bandwidths are incident on the electromagnetic wave absorbing apparatus is illustrated.

Figure 5A:
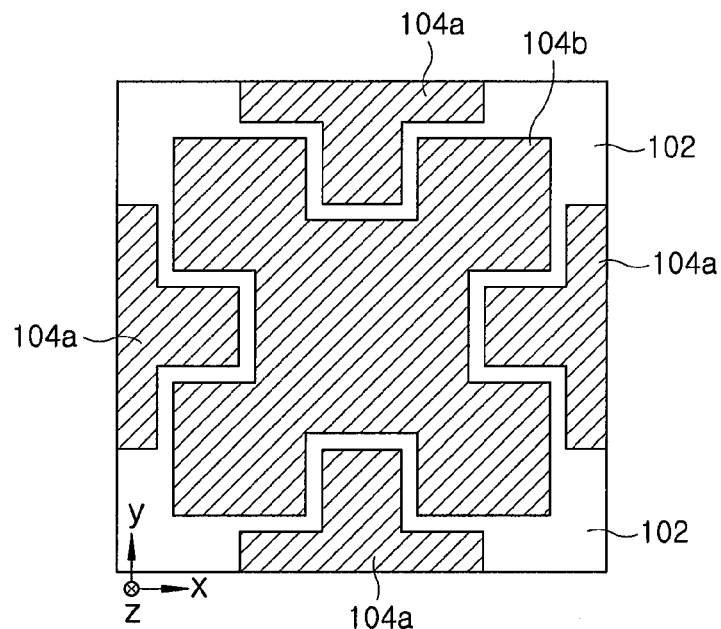
FIGS. 5A and 5B illustrate a structure of a unit cell pattern and a design parameter applicable to an electromagnetic wave absorbing apparatus in an electromagnetic wave reverberation chamber in accordance with the embodiment of the present invention.
Figure 5B:
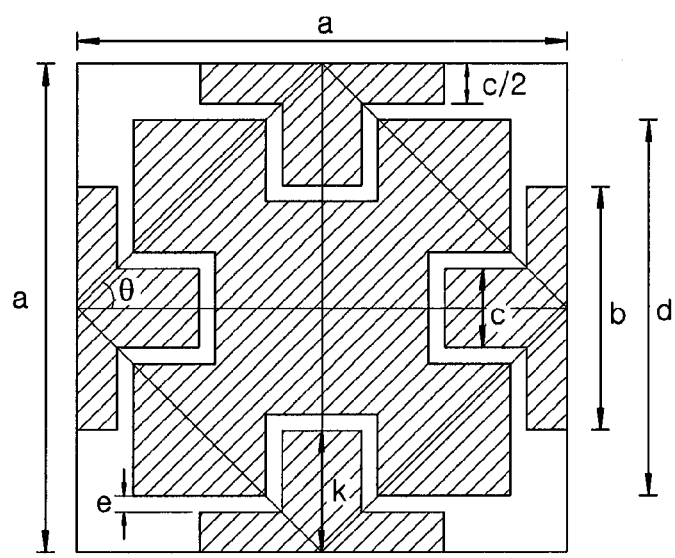

FIGS. 5A and 5B show a structure of a unit cell pattern and a design parameter applicable to an electromagnetic wave absorbing apparatus in accordance with the embodiment of the present invention.

Referring to FIGS. 5A and 5B, the unit cell pattern includes a basic patch 104$b$ located in the center of the unit cell pattern. The shape of the basic patch 104$b$ is a quadrangle whose center of each side is cut by a quadrangle. In addition, the unit cell pattern includes a semi-orthogonal dipole patch 104$a$. The semi-orthogonal dipole patch 104$a$ is arranged to be engaged in each center of the upper side, the bottom side, the left side, the right side of the basic patch 104$b$ at a predetermined gap and angle.

The resonance frequency and the bandwidth of the electromagnetic wave absorbing apparatus can be adjusted by controlling at least one of a structure parameter determining the electrical distance between the basic patch 104$b$ and the semi-orthogonal dipole patch 104$a$, a height from the metal conductor layer to the unit cell pattern, the material characteristic of the dielectric layer, the surface resistance of the unit cell pattern. For example, each of the basic patch 104$b$ and the semi-orthogonal dipole patch 104$a$ can be adjusted to have a different a surface resistance.

Here, the structure parameter determining the electrical distance between the basic patch 104$b$ and the semi-orthogonal dipole patch 104$a$ includes a length of the one side of the unit cell pattern, a length of the side of the semi-orthogonal dipole patch 104$a$ coming into contact with the unit cell pattern, a length of an inner side among sides of the semi-orthogonal dipole patch being coupled with the basic patch, a length of the one side of the quadrangle of the basic patch 104$b$, a gap between the basic patch 104$b$ and the semi-orthogonal dipole patch 104$a$, and a perpendicular height to the one side of the unit cell pattern in the semi-orthogonal dipole patch 104$a$.

Figure 6:
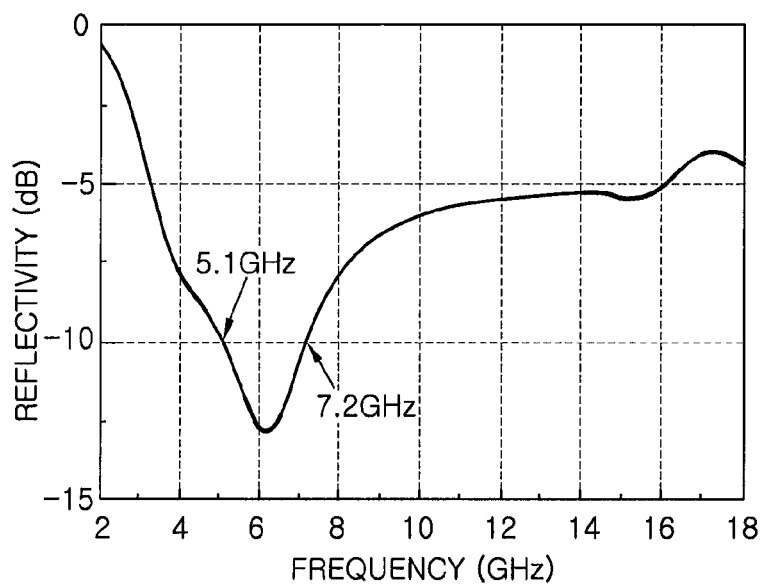
FIG. 6 depicts an absorption performance and a bandwidth of an electromagnetic wave absorbing apparatus having the unit cell pattern structure shown in FIGS. 5A and 5B.

FIG. 6 depicts an absorption performance and a bandwidth when the structure parameter values of the unit cell pattern are Rs=40 Ohm/sq, a=30 mm, b=15 mm, c=5 mm, d=23 mm, e=1 mm, h=4.7 mm, k=7.5 mm, t=0.001 mm, 0=45°, $\in_r$=1 and $\mu_r=1$. A reflectivity expressing the absorption performance can be defined in the following Mathematical Expression 1

$$R \text{ (dB)}=20\times\log(r_{DUT}/r_G) \quad \text{[MATHEMATICAL EXPRESSION 1]}$$

Here, the R, the $r_{DUT}$ and $r_G$ mean the reflectivity, the reflection coefficient of the electromagnetic wave absorbing apparatus and the reflection coefficient of the surface of the metal conductor layer, respectively. The reflectivity of −10 dB means that the 90% of the incident electromagnetic wave is absorbed. The frequency bandwidth having a reflectivity equal to or lower than −10 db base line (1010) is from 5.1 GHz to 7.2 GHz. Thus, a frequency bandwidth according to the embodiment of the present invention is from 5.1 GHz to 7.2 GHz.

Figure 7:
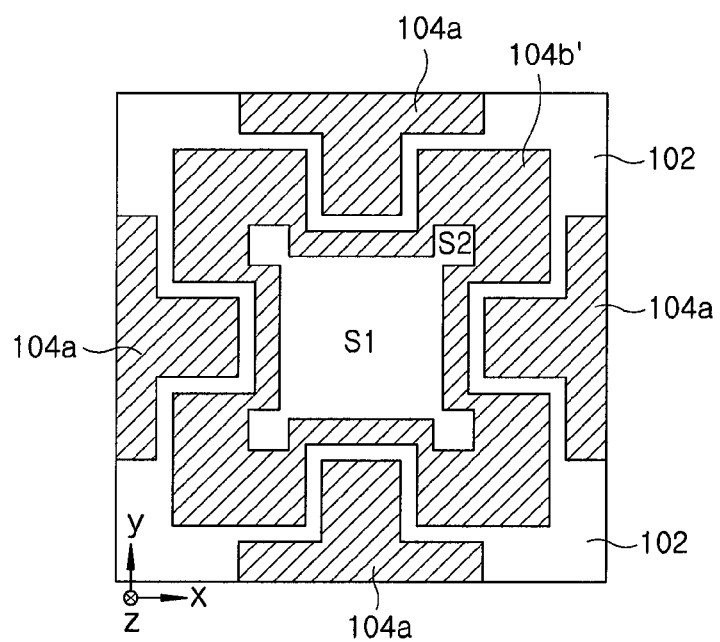
FIG. 7 shows a unit cell pattern in accordance with another embodiment of the present invention.

FIG. 7 shows a unit cell pattern in accordance with other embodiment of the present invention. This is the embodiment modifying the unit cell pattern structure shown in FIGS. 5A and 5B in order to widen the absorption bandwidth and set a higher absorption frequency.

As shown in FIG. 7, the unit cell pattern includes a basic patch 104b' located in the center of the unit cell pattern. The shape of the basic patch 104b' is a quadrangle whose center of each side is cut by a quadrangle. The first slot S1 of a quadrangle structure is formed on the center of the basic patch 104b' and the second slot S2 of a quadrangle structure is formed in each corner of the first slot S1 on the basic patch 104b'. In addition, the unit cell pattern includes a semi-orthogonal dipole patch 104a'. The semi-orthogonal dipole patch 104a' is arranged to be engaged in each center of the upper side, the bottom side, the left side, the right side of the basic patch 104b' at a predetermined gap and angle. For example, as a modified exemplary embodiment, the second slot S2 cannot be formed.

The resonance frequency and the bandwidth of the electromagnetic wave absorbing apparatus can be adjusted by controlling at least one of a structure parameter determining the electrical distance between the basic patch 104b' and the semi-orthogonal dipole patch 104a', a height from the metal conductor layer to the unit cell pattern, the material characteristic of the dielectric layer, the surface resistance of the unit cell pattern, the size of the first slot and the length of the one side of the second slot. In the modified exemplary embodiment where the second slot S2 is not formed, the resonance frequency and the bandwidth of the electromagnetic wave absorbing apparatus can be adjusted by controlling at least one of parameters except the length of the one side of the second slot.

An electromagnetic wave absorbing apparatus is manufactured by arranging periodically the unit cell pattern shown in FIG. 7. For example, the unit cell patterns of the unit cells which are arranged periodically to be adjacent to each other can have a surface resistance valve different from each other. When the unit cell is arranged periodically, at least one of the structures and the resistance values of the unit cell patterns adjacent to each other can be arranged by turns to be different from each other.

Figure 8:
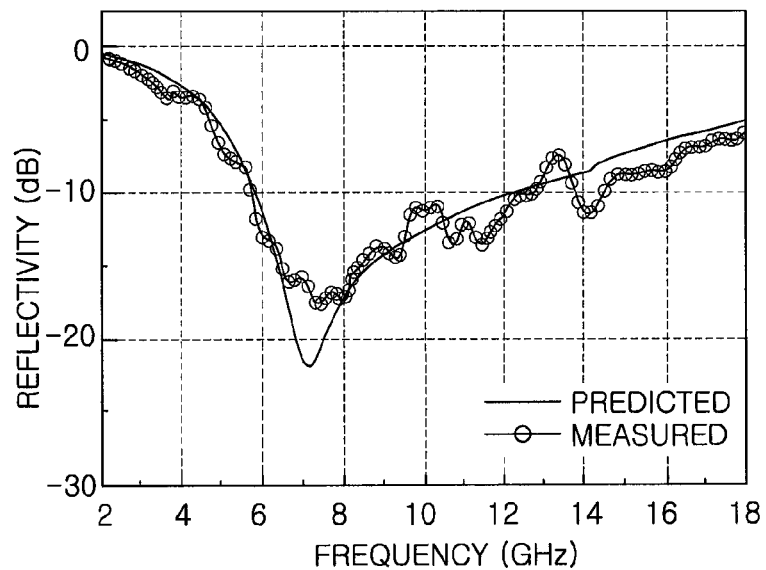
FIG. 8 depicts a graph for a predicted value and an actually measured value of an absorption performance and a bandwidth of the electromagnetic wave absorbing apparatus.

FIG. 8 illustrates a graph for a predicted value and an actually measured value of the electromagnetic wave absorbing apparatus. It is confirmed that the designed electromagnetic wave absorbing apparatus operates actually very similarly to the prediction. In addition, a maximum absorption frequency is raised compared with a prediction result from the unit cell pattern shown in FIGS. 5A and 5B and the absorption bandwidth is widen accordingly. The maximum absorption frequency is 7 GHz and a wavelength is about 43 mm. The thickness of the electromagnetic wave absorbing apparatus is about λ/10 and the thickness of the electromagnetic wave absorbing becomes much thinner than the thickness of the conventional electromagnetic wave absorber, i.e., λ/4.

In addition, when it is considered that the conventional electromagnetic wave absorber having the absorption rate level of about −3~5 dB is commercialized, the electromagnetic wave absorbing apparatus of the present invention can be manufactured to be much thinner at the absorption rate level of about −22 dB.

Figure 9:
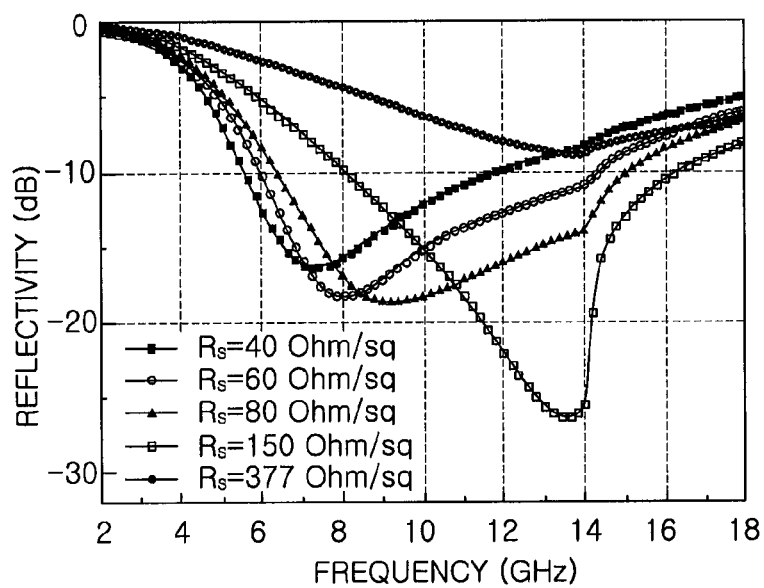
FIG. 9 shows an absorption performance result simulated by changing a surface resistance of a unit cell pattern in the electromagnetic wave absorbing apparatus.

FIG. 9 shows an absorption performance result simulated by changing the surface resistance of the unit cell pattern of the electromagnetic wave absorbing apparatus. The maximum absorption frequency and the absorption bandwidth can be adjusted by changing the surface resistance (Rs).

Figure 10:
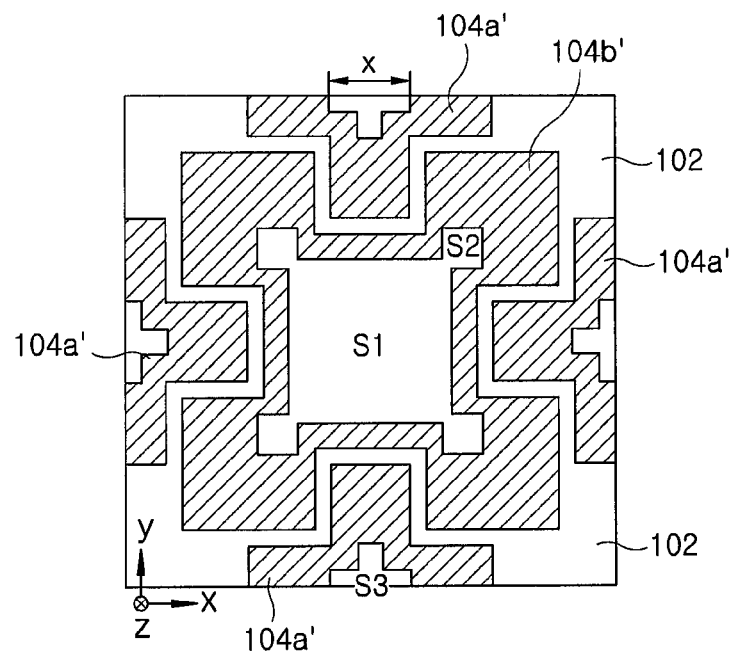
FIG. 10 depicts a unit cell pattern structure in accordance with another embodiment of the present invention.

FIG. 10 depicts a unit cell pattern in accordance with another embodiment of the present invention.

As shown in FIG. 10, the unit cell pattern includes a basic patch 104b' located in the center of the unit cell pattern. The shape of the basic patch 104b' is a quadrangle whose center of each side is cut by a quadrangle. The first slot S1 of a quadrangle structure is formed in the center of the basic patch 104b' and the second slot S2 of a quadrangle structure is formed in each corner of the first slot S1 on the basic patch 104b'. In addition, the unit cell pattern includes a semi-orthogonal dipole patch 104a'. The semi-orthogonal dipole patch 104a' is arranged to be engaged in each center of the upper side, the bottom side, the left side, the right side of the basic patch 104b' at a predetermined gap and angle. In addition, the third slot S3 having the structure of the semi-orthogonal dipole patch is formed on the center of the outer side of the semi-orthogonal dipole patch 104a'. For example, as a modified exemplary embodiment, the first slot S1 and/or the second slot S2 cannot be formed.

The resonance frequency and the bandwidth of the electromagnetic wave absorbing apparatus can be adjusted by controlling at least one of a structure parameter determining the electrical distance between the basic patch 104b' and the semi-orthogonal dipole patch 104a', a height from the metal conductor layer to the unit cell pattern, the material characteristic of the dielectric layer, the surface resistance of the unit cell pattern, the size of the first slot, the length of the one side of the second slot and the size of the third slot. In the modified exemplary embodiment where the first slot S1 and/or the second slot S2 is not formed, the resonance frequency and the bandwidth of the electromagnetic wave absorbing apparatus can be adjusted by controlling at least one of parameters except the size of the first slot and/or the length of the one side of the second slot.

Figure 11:
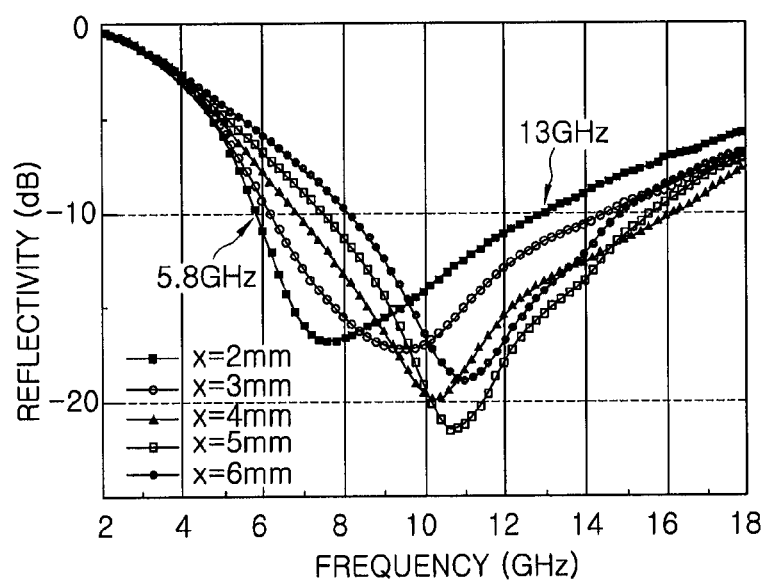
FIG. 11 shows an absorption performance result simulated by changing a length of one side x determining a size of a third slot among the design parameters shown of the unit cell pattern shown in FIG. 10.

FIG. 11 shows an absorption performance result simulated by changing one side determining the size of the third slot S3 among the design parameters of the unit cell pattern. As shown FIG. 11, the absorption performance can be easily controlled by adjusting a physical parameter.

Figure 12:
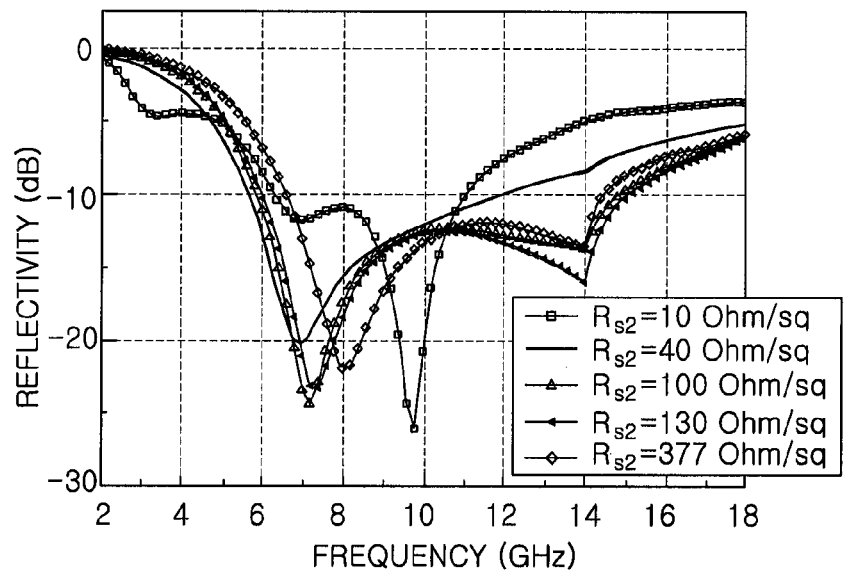
FIG. 12 illustrates a graph for a performance of an electromagnetic absorbing apparatus which is calculated while changing a surface resistance of a basic patch when a value of a surface resistance of a semi-orthogonal dipole patch is fixed to have a conventional design value in the unit cell pattern shown in FIG. 7.

FIG. 12 illustrates the performance change of the electromagnetic absorbing apparatus which is calculated by changing the surface resistance $R_{s2}$ of the basic patch 104b' when the surface resistance $R_{s1}$ of the semi-orthogonal dipole patch 104a' is fixed to have 40 Ohm/sq in the unit cell pattern shown in FIG. 7. As hybrid structure, the absorption bandwidth is enhanced when $R_{s2}$ is larger than 40 Ohm/sq.

Figure 13:
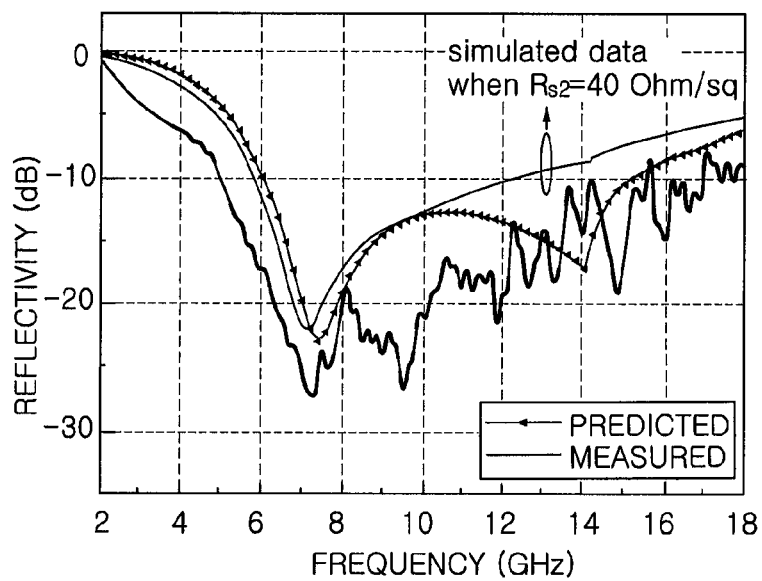
FIG. 13 shows a graph of comparison between a predicted value and an actually measured value obtained by manufacturing an electromagnetic wave absorbing apparatus and performing a measurement when a surface resistance of the basic patch has a specified value.

FIG. 13 shows a graph of comparison between a predicted value and an actually measured value measured by using a manufactured electromagnetic wave absorbing apparatus when the surface resistance of the basic patch in FIG. 12 is 40 Ohm/sq.

As described above, the electromagnetic wave absorbing apparatus included in the electromagnetic wave reverberation chamber in accordance with the embodiments of the present invention can be manufactured to be thinner than the conventional electromagnetic wave absorbers. In addition, the absorption performance (the absorption bandwidth and the maximum absorption frequency) of the electromagnetic wave absorbing apparatus can be easily adjusted by simply modifying the physical parameter and the electrical parameter of the unit cell structure. The unit cell structures having the absorption performance by the design process are a basic unit cell structure of the electromagnetic wave absorbing apparatus based on the periodic structure according to the embodiments of the present invention and the unit cell structures can absorb selectively frequencies in the different frequency bandwidths.

Meanwhile, the embodiments of the present invention can be variously modified. For example, the third slot of FIG. 10 can be formed in the semi-orthogonal dipole patch of the unit cell pattern shown in FIGS. 5A and 5B.

In addition, the unit cell pattern can be designed to have various shapes, e.g., polygons such as quadrangle and triangle, circle type and loop type etc. and a bandwidth and an electromagnetic wave absorption frequency can be changed by the electrical length and the characteristic of the corresponding structure.

In accordance with the embodiments of the present invention, the reflection characteristic of the electromagnetic wave inside the electromagnetic wave reverberation chamber can be improved by providing the electromagnetic wave reverberation chamber including a small and thin electromagnetic wave absorbing apparatus which a periodic structure technology such as electromagnetic bandgap is applied to. The intensity of the electromagnetic wave can be uniform and the propagating directions are uniform in all directions inside the electromagnetic wave reverberation chamber. In addition, since the size of the electromagnetic wave absorbing apparatus is small, the usable space inside the electromagnetic wave reverberation chamber can be extended.

Thus, since a user can use a larger inside space of the electromagnetic wave reverberation chamber, the user can test devices having various sizes and smaller space of the electromagnetic wave reverberation chamber is required for the same device, the manufacturing cost of the electromagnetic wave reverberation chamber can be reduced.

While the invention has been shown and described with respect to the embodiments, it will be understood by those skilled in the art that various changes and modification may be made without departing from the scope of the invention as defined in the following claims.

What is claimed is:

1. An electromagnetic wave reverberation chamber, comprising:
   an electromagnetic wave absorbing apparatus installed in the electromagnetic wave reverberation chamber, the electromagnetic wave absorbing apparatus being configured to adjust a reflection characteristic of an Inside of the electromagnetic wave reverberation chamber;
   the electromagnetic wave absorbing apparatus having an electromagnetic bandgap structure including a plurality of unit cells arranged periodically; and
   each unit cell including a metal conductor layer, a dielectric layer formed on the metal conductor layer, and a unit cell pattern formed on the dielectric layer,
   wherein the unit cell pattern is made of a metal material with a resistive film formed on the metal material.

2. The electromagnetic wave reverberation chamber of claim 1, wherein the metal material is interposed between the dielectric layer and the resistive film.

3. The electromagnetic wave reverberation chamber of claim 1, wherein the unit cell pattern has at least one shape of polygon, circle and loop.

4. The electromagnetic wave reverberation chamber of claim 1, wherein the unit cell patterns of the unit cells arranged periodically to be adjacent to each other have different surface resistance values.

5. The electromagnetic wave reverberation chamber of claim 1, wherein the unit cells are arranged periodically by turns so that at least one of resistances and structures of the unit cell patterns adjacent to each other is different from each other.

6. The electromagnetic wave reverberation chamber of claim 1, wherein the unit cell pattern includes a basic patch which is located in a center of the unit cell pattern, the basic patch having a quadrangle shape whose center of each side is cut by a quadrangle; and a semi-orthogonal dipole patch arranged to be engaged in each center of an upper side, a bottom side, a left side and a right side of the basic patch at a predetermined gap and angle.

7. The electromagnetic wave reverberation chamber of claim 6, wherein the electromagnetic wave absorber apparatus has a resonance frequency and a bandwidth which are established based on at least one of a height from the metal conductor layer to the unit cell pattern, a material characteristic of the dielectric layer, a surface resistance of the unit cell pattern, and structure parameters determining an electrical distance between the basic patch and the semi-orthogonal dipole patch,
   wherein the structure parameters include at least one of a length of one side of the unit cell pattern, a length of a side of the semi-orthogonal dipole patch coming into contact with the unit cell pattern, a length of an inner side among sides of the semi-orthogonal dipole patch being coupled with the basic patch, a length of one side of a quadrangle of the basic patch, a gap between the basic patch and the semi-orthogonal dipole patch, and a perpendicular height to one side of the unit cell pattern in the semi-orthogonal dipole patch.

8. The electromagnetic wave reverberation chamber of claim 6, wherein a first slot in a shape of a quadrangle is formed in a center of the basic patch.

9. The electromagnetic wave reverberation chamber of claim 8, wherein a second slot in a shape of a quadrangle is formed at each corner of the first slot on the basic patch.

10. The electromagnetic wave reverberation chamber of claim 9, wherein the electromagnetic wave absorber apparatus has a resonance frequency and a bandwidth which are established based on at least one of a height from the metal conductor layer to the unit cell pattern, a material characteristic of the dielectric layer, a surface resistance of the unit cell pattern, a size of the first slot, a length of one side of the second slot, and structure parameters determining an electrical distance between the basic patch and the semi-orthogonal dipole patch,
   wherein the structure parameters include at least one of a length of one side of the unit cell pattern, a length of a side of the semi-orthogonal dipole patch coming into contact with the unit cell pattern, a length of an inner side among sides of the semi-orthogonal dipole patch being coupled with the basic patch, a length of one side of a quadrangle of the basic patch, a gap between the basic patch and the semi-orthogonal dipole patch, and a perpendicular height to one side of the unit cell pattern in the semi-orthogonal dipole patch.

11. The electromagnetic wave reverberation chamber of claim 6, wherein the electromagnetic wave absorber apparatus has a resonance frequency and a bandwidth which are established based on at least one of a height from the metal conductor layer to the unit cell pattern, a material characteristic of the dielectric layer, a surface resistance of the unit cell pattern, a size of a first slot formed in the center of the basic patch, and structure parameters determining an electrical distance between the basic patch and the semi-orthogonal dipole patch, wherein the structure parameters include at least one of a length of one side of the unit cell pattern, a length of a side of the semi-orthogonal dipole patch coming into contact with the unit cell pattern, a length of an inner side among sides of the semi-orthogonal dipole patch being coupled with the basic patch, a length of one side of a quadrangle of the basic patch, a gap between the basic patch and the semi-orthogonal dipole patch, and a perpendicular height to one side of the unit cell pattern in the semi-orthogonal dipole patch.

12. The electromagnetic wave reverberation chamber of claim 6, wherein a third slot in a shape of the semi-orthogonal dipole patch is formed on a center of an outer side of the semi-orthogonal dipole patch.

13. The electromagnetic wave reverberation chamber of claim 12, wherein the electromagnetic wave absorber apparatus has a resonance frequency and a bandwidth which are established based on at least one of a height from the metal conductor layer to the unit cell pattern, a material characteristic of the dielectric layer, a surface resistance of the unit cell pattern, a size of the third slot, and structure parameters determining an electrical distance between the basic patch and the semi-orthogonal dipole patch, wherein the structure parameters include at least one of a length of one side of the unit cell pattern, a length of a side of the semi-orthogonal dipole patch coming into contact with the unit cell pattern, a length of an inner side among sides of the semi-orthogonal dipole patch being coupled with the basic patch, a length of one side of a quadrangle of the basic patch, a gap between the basic patch and the semi-orthogonal dipole patch, and a perpendicular height to one side of the unit cell pattern in the semi-orthogonal dipole patch.

14. The electromagnetic wave reverberation chamber of claim 12, wherein a first slot in a shape of a quadrangle is formed in a center of the basic patch, and the electromagnetic wave absorber apparatus has a resonance frequency and a bandwidth which are established based on at least one of a height from the metal conductor layer to the unit cell pattern, a material characteristic of the dielectric layer, a surface resistance of the unit cell pattern, a size of the first slot, a size of the third slot, and structure parameters determining an electrical distance between the basic patch and the semi-orthogonal dipole patch, wherein the structure parameters include at least one of a length of one side of the unit cell pattern, a length of a side of the semi-orthogonal dipole patch coming into contact with the unit cell pattern, a length of an inner side among sides of the semi-orthogonal dipole patch being coupled with the basic patch, a length of one side of a quadrangle of the basic patch, a gap between the basic patch and the semi-orthogonal dipole patch, and a perpendicular height to one side of the unit cell pattern in the semi-orthogonal dipole patch.

15. The electromagnetic wave reverberation chamber of claim 12, wherein a first slot in a shape of a quadrangle is formed in a center of the basic patch and a second slot in a shape of a quadrangle is formed at each corner of the first slot on the basic patch, and wherein the electromagnetic wave absorber apparatus has a resonance frequency and a bandwidth which are established based on at least one of a height from the metal conductor layer to the unit cell pattern, a material characteristic of the dielectric layer, a surface resistance of the unit cell pattern, a size of the first slot, a length of one side of the second slot, a size of the third slot, and structure parameters determining an electrical distance between the basic patch and the semi-orthogonal dipole patch, wherein the structure parameters include at least one of a length of one side of the unit cell pattern, a length of a side of the semi-orthogonal dipole patch coming into contact with the unit cell pattern, a length of an inner side among sides of the semi-orthogonal dipole patch being coupled with the basic patch, a length of one side of a quadrangle of the basic patch, a gap between the basic patch and the semi-orthogonal dipole patch, and a perpendicular height to one side of the unit cell pattern in the semi-orthogonal dipole patch.

16. The electromagnetic wave reverberation chamber of claim 6, wherein the basic patch and the semi-orthogonal dipole patch have different surface resistance values.

* * * * *